US006678193B2

United States Patent
Kim et al.

(10) Patent No.: US 6,678,193 B2
(45) Date of Patent: Jan. 13, 2004

(54) APPARATUS AND METHOD FOR TRACKING BETWEEN DATA AND ECHO CLOCK

(75) Inventors: Young-Tae Kim, Seoul (KR); Chul-Sung Park, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 209 days.

(21) Appl. No.: 09/916,731

(22) Filed: Jul. 26, 2001

(65) Prior Publication Data

US 2002/0008554 A1 Jan. 24, 2002

(30) Foreign Application Priority Data

Jul. 27, 2000 (KR) ........................................ 2000-43323

(51) Int. Cl.[7] .............................................. G11C 16/04
(52) U.S. Cl. ........................... 365/189.05; 365/189.08; 365/193; 365/194; 365/233
(58) Field of Search ................ 365/189.05, 194, 365/193, 233, 189.08

(56) References Cited

U.S. PATENT DOCUMENTS

| 5,940,328 A | | 8/1999 | Iwamoto et al. ........ 365/189.01 |
| 5,949,721 A | * | 9/1999 | Kwon et al. ............ 365/189.11 |
| 5,986,948 A | | 11/1999 | Cloud .................... 365/193 |
| 6,003,118 A | | 12/1999 | Chen ...................... 711/167 |
| 6,021,081 A | | 2/2000 | Higashide et al. .......... 365/226 |
| 6,029,250 A | | 2/2000 | Keeth .................... 713/400 |
| 6,278,637 B1 | * | 8/2001 | Kawaguchi ............ 365/189.05 |
| 6,353,575 B2 | * | 3/2002 | Lee ...................... 365/233 |

OTHER PUBLICATIONS

Harold Pilo, et al. (IBM Microelectronics, Essex Junction, VT); ISSCC 2000 / Session 16 / Non–Volatile and SRAM / Paper TP 16.2; "Variable Delay Clock Driver and Data–to–Echo Tracking System"; IEEE, ISSCC 2000 Slide Supplement; pp. 214, 215.

* cited by examiner

Primary Examiner—Michael S. Lebentritt
Assistant Examiner—Pho Luu
(74) Attorney, Agent, or Firm—Marger Johnson & McCollom, P.C.

(57) ABSTRACT

An output buffer has a data unit for buffering data for an off chip driver. The output buffer also includes an echo clock signal generator for generating an echo clock signal associated with the buffered data. The echo clock signal is generated responsive to either a buffer control signal that controls the data unit, or to the data itself. The buffer control signal or the data is mixed with an echo control signal to generate a reset signal. The echo control signal is outputted, responsive to the reset signal, as the echo clock signal. This prevents skew from developing between the data and the echo clock signal. A method includes buffering data for an off chip driver, and generating and outputting to the off chip driver an echo clock signal to accompany the data. The echo clock signal is generated responsive to either a buffer control signal that controls the data unit or to the data itself.

8 Claims, 10 Drawing Sheets

APPARATUS AND METHOD FOR TRACKING BETWEEN DATA AND ECHO CLOCK

This application claims priority from Korean Priority Document No. 00-43323, filed on Jul. 21, 2000 with the Korean Industrial Property Office, which document is hereby incorporated by reference.

BACKGROUND OF THE INVENTION

1. Field of the Invention

The present invention relates to an apparatus and method for using echo clocks. More particularly the invention relates to synchronous memory products and related methods for outputting data according to echo clocks without permitting skew to develop, while adapting to changes in the operating cycle due to high speed operations and the like.

2. Brief Description of the Prior Art

Most synchronous products tend to require echo clocks. For instance, in semiconductor memory devices, echo clocks are synchronous signals generated with internal data outputs, and serve as strobe signals to be provided to peripheral systems for tracking the data outputs. The echo clocks are thus also called strobe clocks. In other words, echo clocks are generated by the request of a chip utilizing system.

In the case of semiconductor memory chips, the system uses the echo clock (also referred to as "CQ") as a reference clock for inputting output data (Dout), which are also referred to as "DQ". Accordingly, DQ should be provided to a system under the identical condition as CQ at all times, without allowing any skew to develop. As a result, it is possible to maximize setup and hold margin time of the DQ. The aforementioned factor influences the stabilization and speedup of the system.

Speed skews have generally appeared between data and echo clocks due to changes in the operating cycles of the chip. The frequency of operating cycles is reduced, as the chip speeds up. The reduction of the frequency of the operating cycles results in an increase of data outputting speed. However, the echo clocks have been generated at a constant speed regardless of the frequency of the operating cycles, which results in speed skews between outputting data and echo clocks.

The situation is even more of a problem in ultra-high speed semiconductor memory devices using echo clocks, for instance, in synchronous double data rate static products. Skew is even more certain to be generated, which causes operational instability of the system, and failure in speedup of the system.

It is desired to have a semiconductor memory device that presents no skew at either long cycles or short cycles, does not present needless delays, is not complex, and may still perform read and write operations.

SUMMARY OF THE INVENTION

It is an object of the present invention to solve the aforementioned problems.

Accordingly, the invention provides an output buffer that has a data unit for buffering data for an off chip driver. The output buffer also includes an echo clock signal generator for generating an echo clock signal associated with the buffered data. The echo clock signal is generated responsive to either a buffer control signal that controls the data unit, or to the data itself.

A method includes buffering data for an off chip driver, and generating and outputting to the off chip driver an echo clock signal to accompany the data. The echo clock signal is generated responsive to either a buffer control signal that controls the data unit or to the data itself.

The present invention therefore provides semiconductor memory devices that present no skew at either long cycles or short cycles, do not present needless delays, are not complex, and may still perform read and write operations.

DETAILED DESCRIPTION OF THE INVENTION

Figure 1:
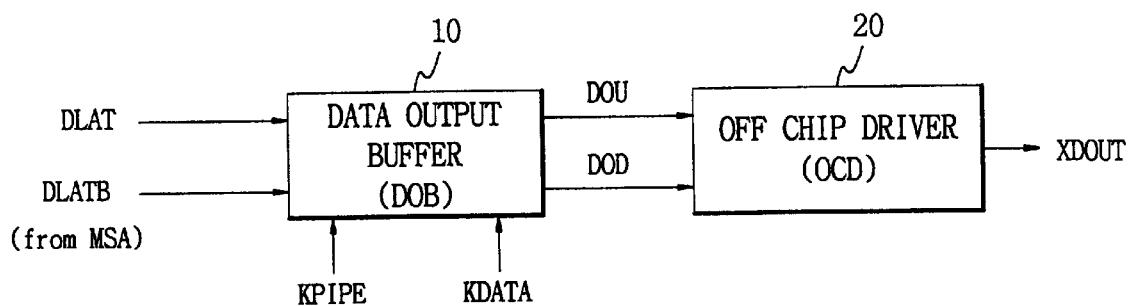
FIG. 1 is a block diagram for illustrating a general data reading route of a synchronous semiconductor memory.
Figure 5:
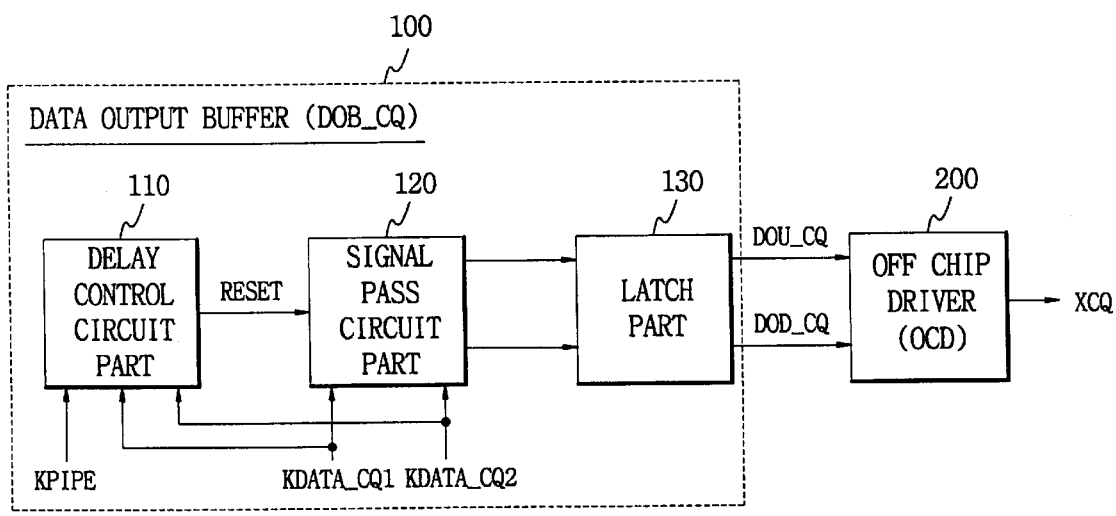
FIG. 5 is a block diagram for illustrating a circuit of generating an external output echo clock in accordance with the preferred embodiment of the present invention.
Figure 6:
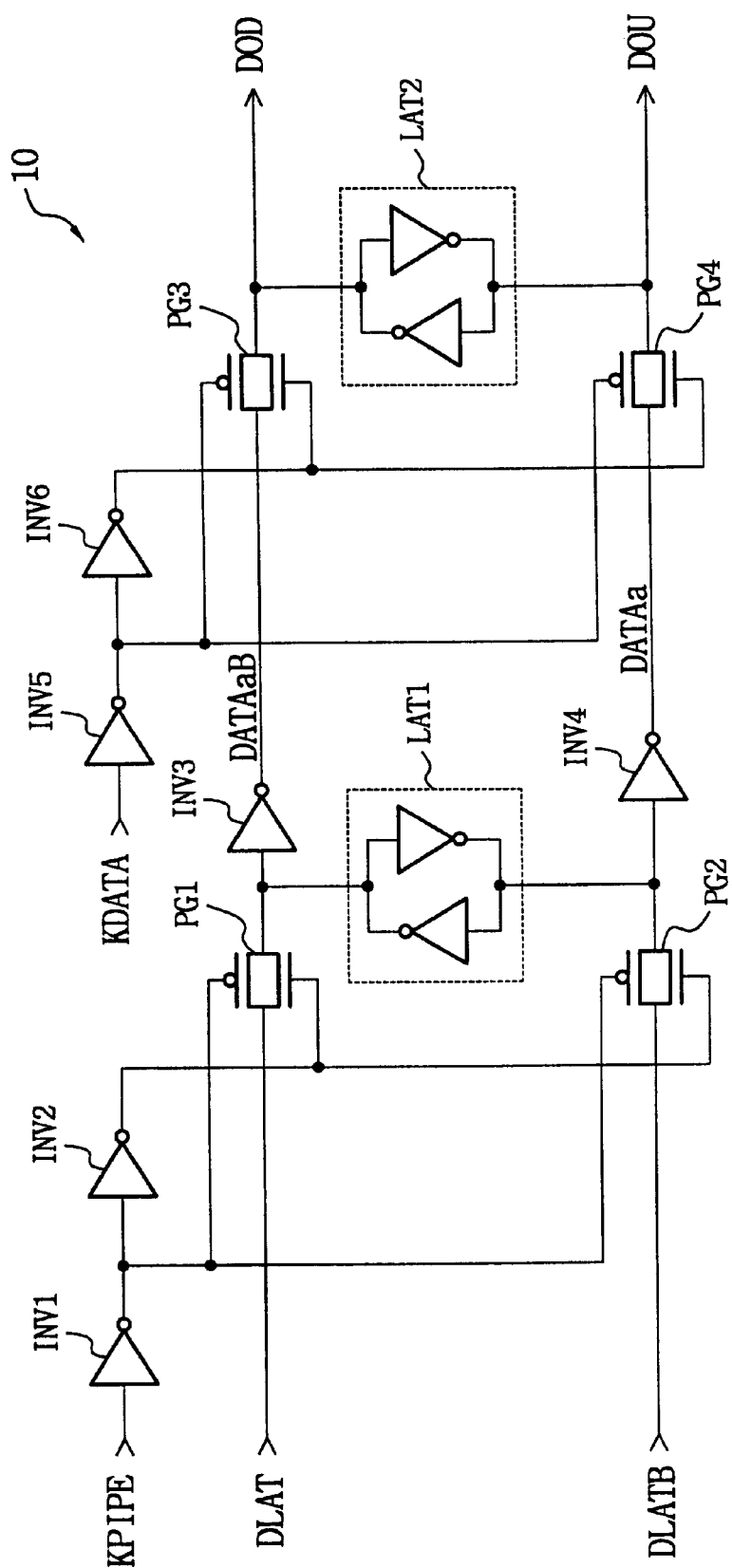
FIG. 6 is an exemplary view for illustrating a specific circuit of the data output buffer (DOB) shown in FIG. 1.

As will be appreciated from the above, FIG. 1 and FIG. 6 are views for illustrating the structure and circuit of a general data reading route in a synchronous semiconductor memory device. FIGS. 2, 3, 7, 8, 10 and 12 are views related to compared embodiments of the prior art, while FIGS. 4, 5, 9, 11 and 13 are views related to the present invention. Hereinafter, the compared embodiments of the prior art and the preferred embodiments of the present invention will be described in detail with reference to the accompanying drawings.

It should be noted that like reference numerals are used for designation of like or equivalent parts or portion for simplicity of illustration and explanation for all the drawings. Plus, for this detailed description of the present invention, all signals will be defined as follows:

DQ: output data
CQ: echo clock
XCK: external clock
DLAT/DLATB: data signal pair generated by a main sense amplifier
KPIPE: pipeline driving signal, data latching pulse signal (Dout Data latch pulse)
DATAa/DATAaB: latch data pair
KDATA: data fetch clock (Dout fetch clock)
DOU/DOD: data output signal pair
XDOUT: external output data
KDATA_CQ1: the first pulse signal
KDATA_CQ2: the second pulse signal
RESET: delay control signal (reset signal)
XCQ: external output echo clock
DOU_CQ: pull-up echo clock
DOD_CQ: pull-down echo clock Now, a brief description will be made about a general data reading route, and comparisons and descriptions will be made about an external echo clock generating circuit and its relevant method in accordance with the prior art and the present invention.

For this description, an output buffer may work together with an off-chip driver. The buffer may be of a synchronous pipelined semiconductor memory device. Each may include a data path and an echo clock path.

Referring to FIG. 1, a block diagram is given for briefly illustrating a general data reading route of a synchronous pipelined semiconductor memory device. The synchronous pipelined semiconductor memory device includes a Dout Output Buffer (DOB) 10 (also known as a data unit circuit 10), which may be part of a larger output buffer. In addition, the synchronous pipelined semiconductor memory device includes an Off Chip Driver (OCD) 20 (also known as a data unit circuit 20), which may be part of a larger off chip driver.

Data of a corresponding memory cell of a memory cell array (not shown) is read when an external access signal designates a row and column address. The read data is then passed through a column selection part (not shown), and sequentially amplified with a Block Sense Amplifier (BSA: not shown) and a Main Sense Amplifier (MSA: not shown) to a predetermined level of data. The amplified data is finally latched at DOB 10.

More particularly, DLAT/DLATB indicate data, which have been output from a general cell and passed through a sensing scheme, a local sense amplifier and an input/output sense amplifier (I/O SA).

The DOB 10 firstly latches the data signal pair (DLAT/DLATB) inputted from the MSA as a pipeline driving signal, in response to a data latching pulse signal (hereinafter referred to as "KPIPE"). KPIPE is a pulse signal made from an external clock, playing a part to latch DLAT/DLATB at latch 1 (LAT 1) at the current cycle of a general synchronous pipeline product.

Then, the firstly latched data are passed in response to a data fetch clock (KDATA), and inputted to OCD 20 as the secondly latched data output pair (DOD/DOU). Then the OCD 20 outputs the data output pair DOD/DOU as external output data (XDOUT).

FIG. 6 is a circuit diagram for the data output buffer (DOB) shown in FIG. 1. If the KPIPE shifts to pulse "High", the pass gates PG1, PG2 turn on to latch the DLAT/DLATB at latch 1 (LAT1). Thus, it is noted that both end nodes of latch 1 are inverting at ends of the latch DATAa/DATAaB. Similarly, the KDATA signal passes the DATAa/DATAaB (latched by the KPIPE at the current cycle), through pass gates PG3, PG4 at the following cycle to be latched at latch 2 (LAT2). In other words, DATAa/DATAaB pass through DOD/DOU at the following cycle, to be output by OCD 20 as a final XDOUT.

As described above, the general method of a synchronous pipelined product is that a data Dout is output as Dout after being inputted from a cell to a data output buffer 10.

Figure 2:
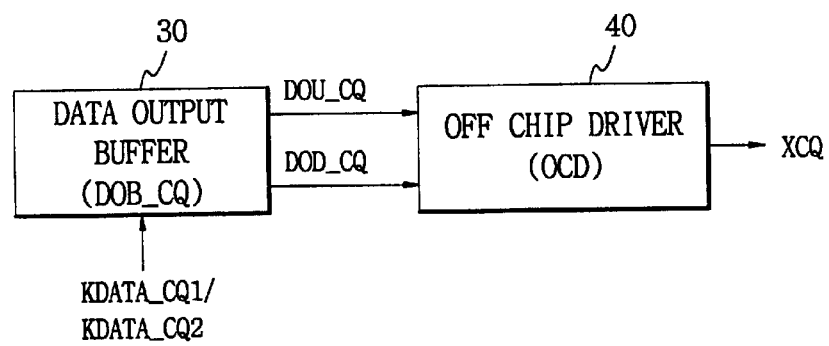
FIG. 2 is a block diagram for illustrating generation of an external output echo clock in accordance with the first compared embodiment of the present invention.

Referring now to FIG. 2, echo clock generating blocks of a synchronous pipelined product will be described in accordance with the first and second compared embodiments. A data output buffer DOB_CQ 30 (also called echo clock unit circuit DOB_CQ 30) may be part of a larger output buffer. An Off Chip Driver 40 (also called echo clock unit circuit 40) may be part of a larger off chip driver. Data output buffer DOB_CQ 30 generates signals DOU_CQ and DOD_CQ, which are input in Off Chip Driver 40. Then Off Chip Driver 40 outputs the external output echo clocks (XCQ) to the outside (for instance, out of the system).

Figure 7:
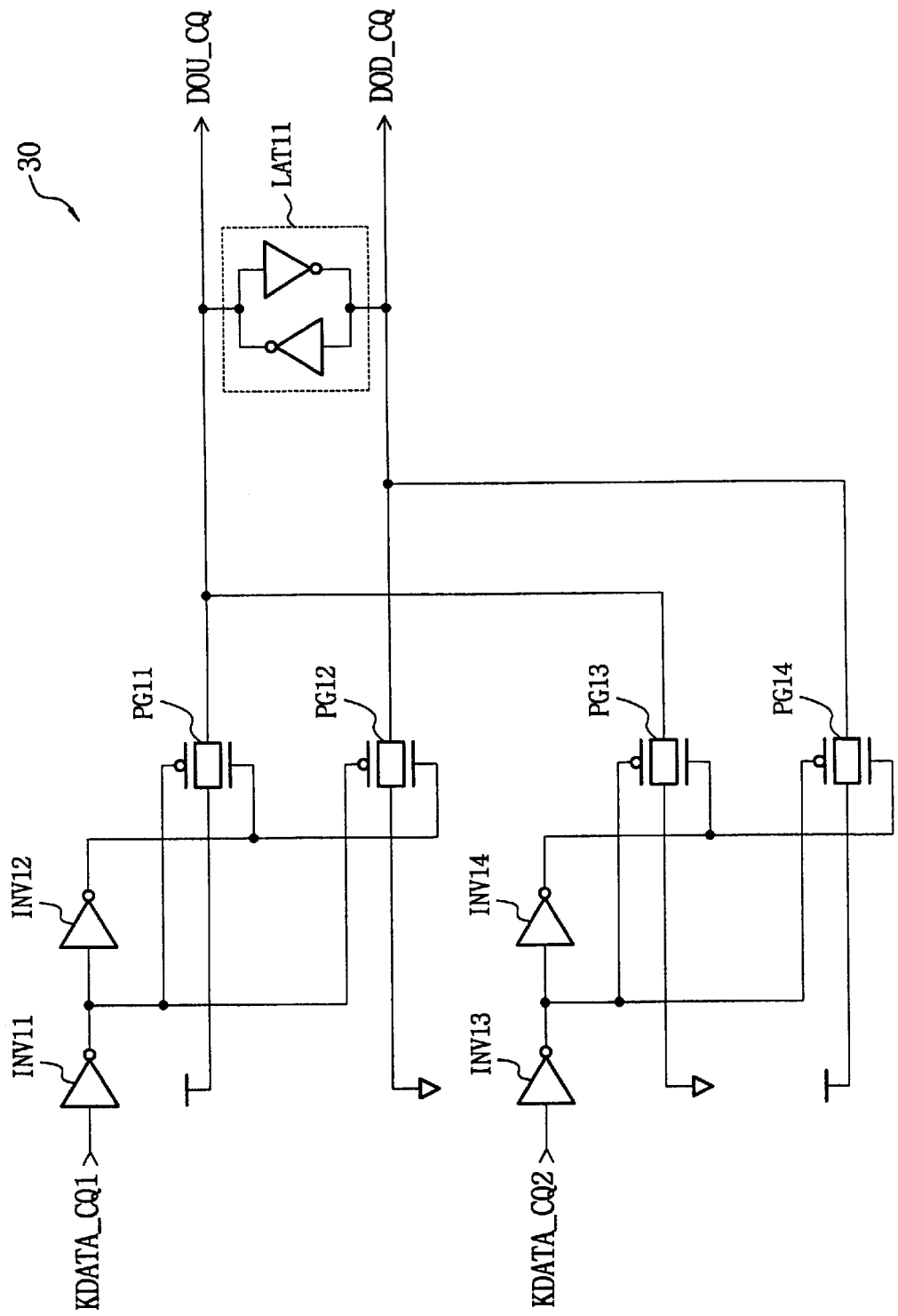
FIG. 7 is an exemplary view for illustrating a specific circuit of the data output buffer (DOB-CQ) shown in FIG. 2 in accordance with the first compared embodiment of the present invention.
Figure 8:
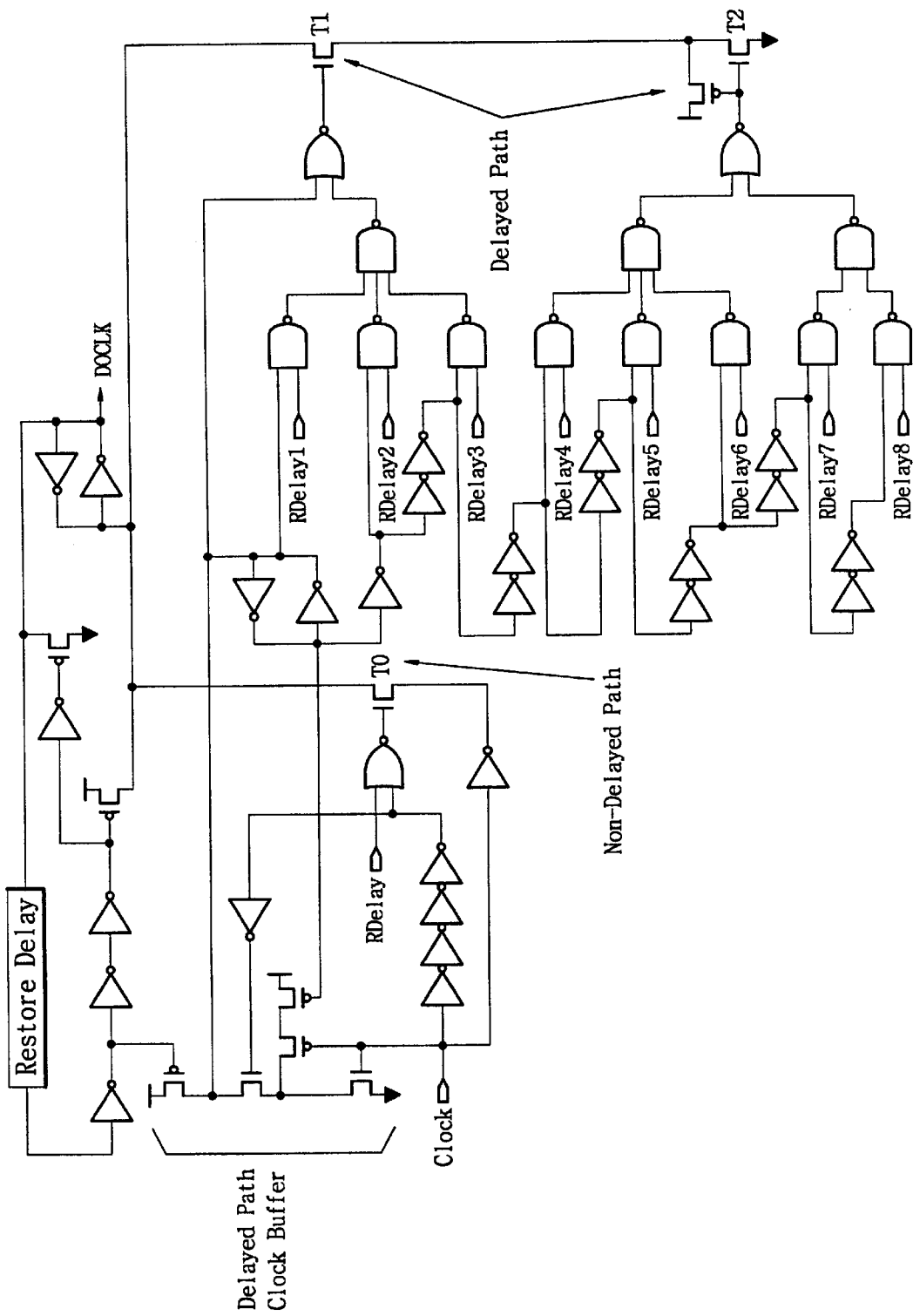
FIG. 8 is an exemplary view for illustrating a specific circuit of generating a variable delay clock in accordance with the second compared embodiment of the present invention.

FIG. 7 is a circuit diagram of data output buffer DOB_CQ 30. Pulse signals KDATA_CQ1 and KDATA_CQ2 are generated alternatingly, and used for generating echo clock signals DOU_CQ, DOD_CQ. These are latched by latch LAT11.

Echo clock unit DOB_CQ 30 includes four pass gates PG11 through PG14. These are controlled in pairs by pulse signals KDATA_CQ1 and KDATA_CQ2, through four inverters INV11–INV14.

Figure 10:
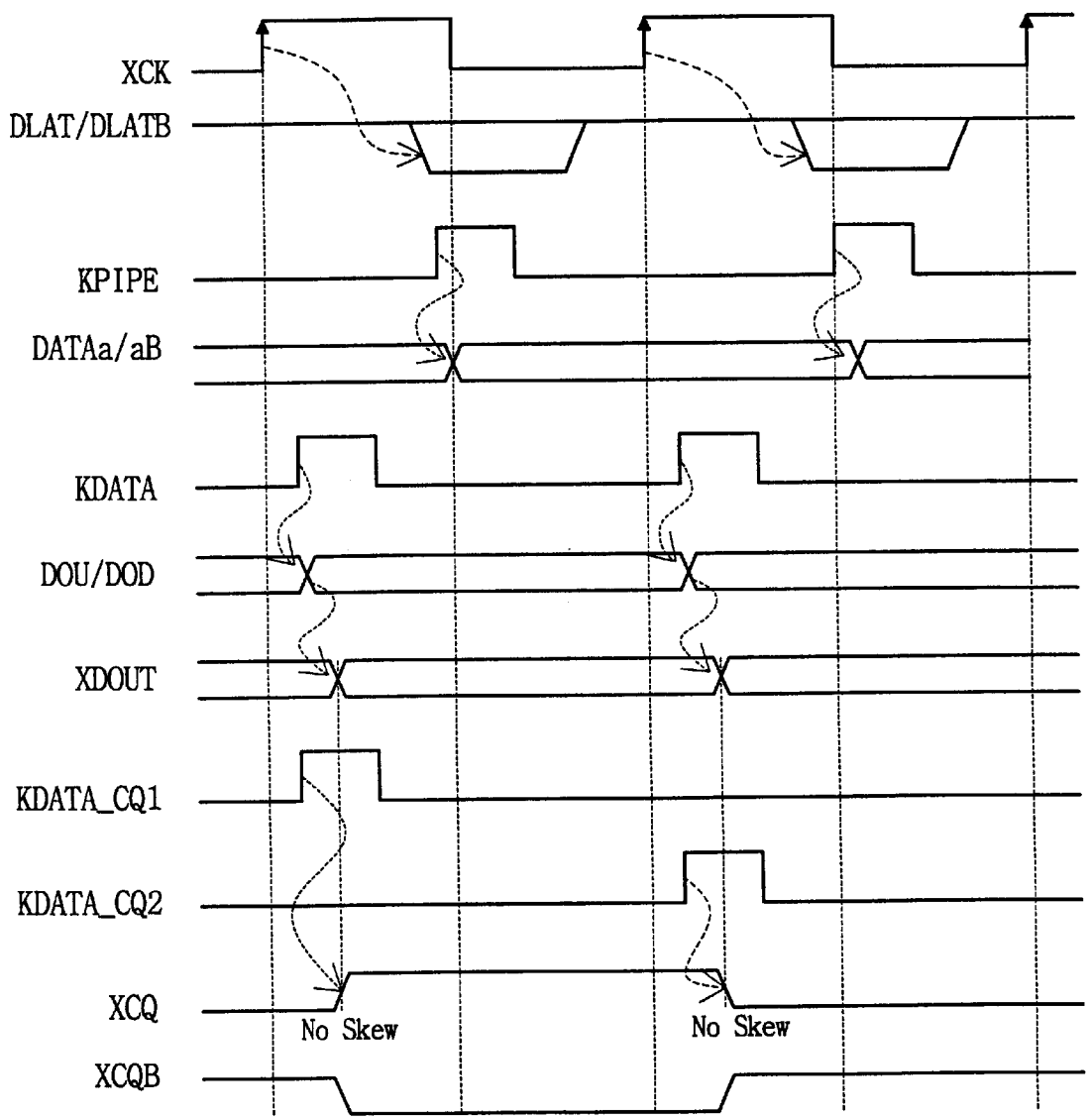
FIG. 10 illustrates wave form views of signals at the long cycle in the first compared embodiment.
Figure 12:
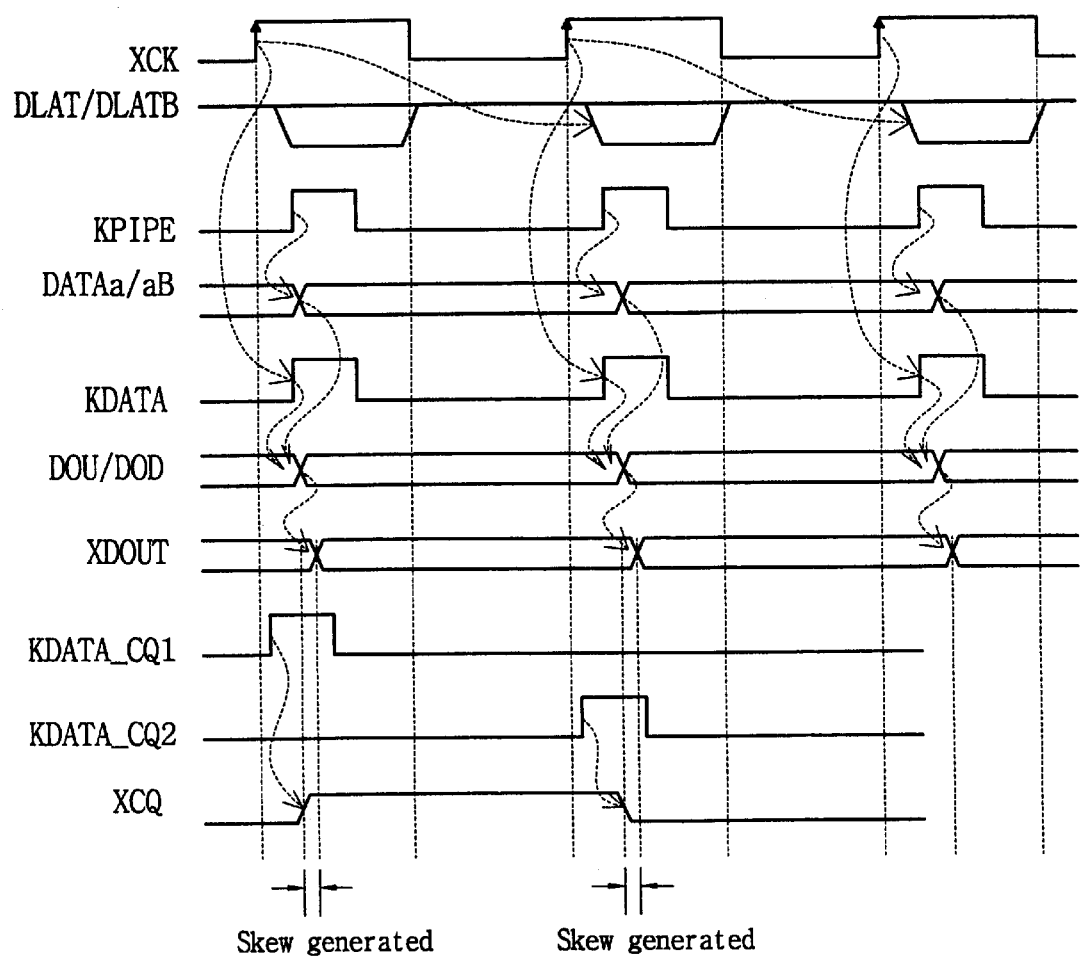
FIG. 12 illustrates wave form views of signals at the short cycle in the first compared embodiment.

Referring now to FIG. 10 and FIG. 12, the KDATA_CQ1 and KDATA_CQ2 signals are generated at the same time as the KDATA signal. In FIG. 7, when the KDATA_CQ1 shifts to "high", the DOU_CQ turns "high", and the DOD_CQ "low", and the final XDOUT becomes "high". At the following cycle the KDATA_CQ1 turns "low". When the KDATA_CQ2 turns "high", the DOU_CQ turns "low", the DOD_CQ "high", and the final XDOUT becomes "low". Likewise, the CQ (XCQ) alternatively generates in the form of "high" and "low" at every cycle.

More particularly, FIG. 10 is a signal wave form view at the long cycle in the embodiment of FIG. 1. As can be seen, at the long cycle, DATAa/DATAaB latch in a sufficient margin earlier than the KDATA of the following cycle, so that there is no difference in the speed of XDOUT and XCQ. Since the XCQ alternatively generate in the form of "high" and "low" as the first and second pulse signals, KDATA_CQ1 and KDATA_CQ2 generate in turns. In addition, XCQ always outputs simultaneously with XCQB as a pair of "high" and "low" data at every cycle.

Moreover, FIG. 12 is a signal wave form view at the short cycle in the embodiment of FIG. 1. As can be seen, at the short cycle, a speed skew is generated between XDOUT and XCQ. While there is no difference in the speed of generating CQ at the short cycle from at the long cycle, the DQ speed is delayed by the reduction of operating cycles to keep up with the higher speed operation. XDOUT delays in speed as long as the DATAa/DATAaB latches later than KDATA, thereby forming a speed skew between XCQ and XDOUT. In other words, at the short cycle DATAa/DATAaB are generated and overlap KDATA, thereby causing a delay in the speed of DOUT, but the speed of XCQ is kept constant at the long and short cycles, thereby causing a speed skew with the XDOUT.

Figure 3:
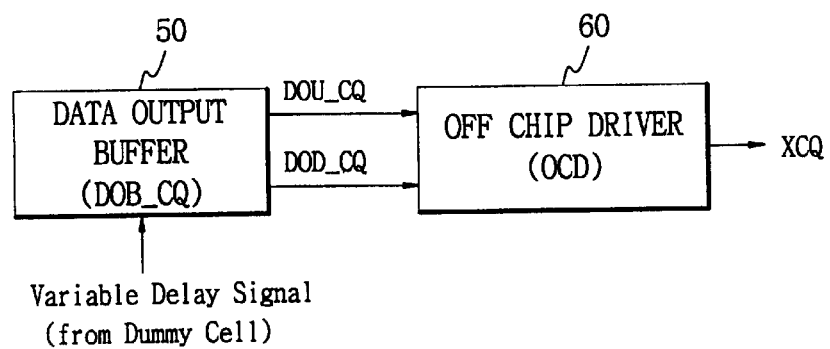
FIG. 3 is a block diagram for illustrating generation of an external output echo clock in accordance with the second compared embodiment of the present invention.

Referring now to FIG. 3, a second prior art embodiment is described. The embodiment of FIG. 3 is disclosed by IMB co. in the IEEE paper, "ISSCC 2000 SLIDE SUPPLEMENT 215" titled "Variable delay clock driver and Data-to-Echo Clock Tracking System", which describes generation of echo clocks.

According to FIG. 3, another data output buffer DOB_CQ 50 is described, which is also known as echo clock unit 50. Data output buffer DOB_CQ 50 receives a variable delay signal from a memory signal.

FIG. 7 is a detailed schematic for the circuit of data output buffer DOB_CQ 50. Variable delay clocks are received from dummy cells, and utilized to delay echo clocks as much as DQ is delayed, so as to prevent generation of a speed skew. The variable control signal is a signal with a time value to be delayed from the dummy cell, which prevents skew from arising in spite of changes in the operating cycles.

The circuit of FIG. 7 is complicated. In addition, as the delay feed-back circuit should be used for generation of variable delay signals, the variable delay clock driver can be driven to cause a needles delay even at the long cycle, where there is no speed skew between data and echo clocks. As a result, a problem is presented in decreasing the operational speed due to the delay of the system access time ($t_{cd}$), which makes it impossible to generate the same echo clocks of for read and write operations.

On the other hand, the present invention relates to a semiconductor memory device to solve the problems of a speed skew between data and echo clocks at the short cycle as in the first compared embodiment, and the complicated structure of the circuit, the reduction in speed due to a delayed access time and the impossibility of generating the same echo clocks of read/write as in the second compared embodiment. A synchronous pipelined product will be described below as a preferred embodiment of the present invention.

For the present invention, the data read route may be the same as in FIG. 1 and FIG. 6. However, FIGS. 4, 5, 9, 11 and 13 illustrate an apparatus and the related method for tracking and generating external output echo clocks adaptively to the delay in the speed of external output data at the short cycle, differently from those of the compared embodiments.

Figure 4:
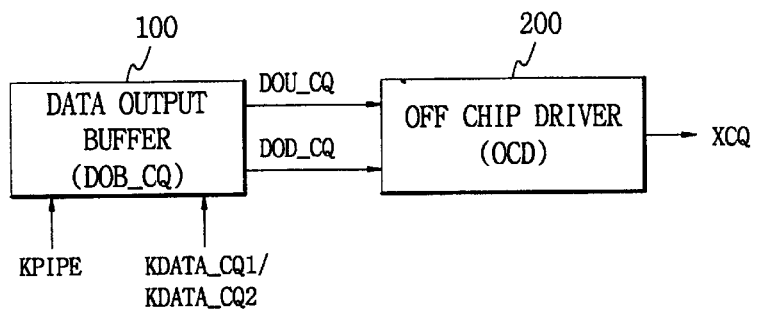
FIG. 4 is a block diagram for illustrating generation of an external output echo clock in accordance with the preferred embodiment of the present invention.

Referring now to FIG. 4, an embodiment of the invention is described. A data output buffer DOB_CQ 100 is also known as echo clock unit 100. It may be used with an off chip driver OCD 200, which is also known as echo clock unit 200. DOB CQ 100 and OCD 200 define the same data read route as described above with reference to FIG. 1. As will be described below, unit 100 prevents skew between data and echo clocks from arising.

Unit 100, along with unit 200, generates external echo clocks XCQ in accordance with the present invention. As will be seen from the below, DATAa/DATAaB (latch data) overlap the KDATA pulse (data fetch clocks) at the echo clock unit DOB_CQ 100 to thereby generate XCQ. In the preferred embodiment, this happens after delaying as long as the delayed speed of XDOUT according to a RESET signal, which is generated by mixing KPIPE (pipelined drive signal) with the KDATA_CQ1 and KDATA_CQ2 through the echo clock unit 40. This happens at short operating cycles (sensed by KPIPE), where there is a delay in the speed of external output data XDOUT.

In one of the preferred embodiments, echo clock unit DOB_CQ 100 includes: a delay control part to delay the first and second pulse signals by using control signals as long as the delayed time of external output data, if any; and an output part to externally output the external output echo clocks, after delaying as long as the delayed time of external output data, by using the delay control circuit of the data output buffer.

Referring now to FIG. 5, a block diagram is given for echo clock unit DOB_CQ 100 of FIG. 4, which is also known as echo clock signal generator. Unit 100 is constructed with a delay control circuit part 110, a signal pass circuit part 120 and a latch part 130. Unit 100 outputs signals DOU_CQ and DOD_CQ, which are also known as echo clock signals.

Compared to the prior art embodiment of FIG. 1, the delay control circuit part 110 is added to unit DOB_CQ 100. This predicts the ultimate delay of external output data XDOUT, by sensing the latch timing of at least one of the buffer control signals.

Returning to FIG. 5, the delay control circuit part 110 generates a RESET signal, which is also known as a delay control signal (RESET). It does that by mixing buffer control signal KPIPE (also known as data latching pulse signal), with an echo control signal (here KDATA_CQ1 and KDATA_CQ2, which are also known as first and second pulse signals). The RESET signal thus senses the duration of the operational cycle, and predicts the delay of the external output data (XDOUT).

The signal pass circuit part 120 is turned on or off by the first and second pulse signals (KDATA_CQ1 and KDATA_CQ2). If there is a delay in the speed of external output data XDOUT it is sensed via the RESET signal. Then the first and second pulse signals KDATA_CQ1 and KDATA_CQ2 are passed as signals, after being delayed by the RESET signal. This way they coincide in time with the delayed external output data XDOUT.

The latch part 130 stores signals that are output from the signal pass circuit part 120.

Returning briefly to FIG. 4, the signals stored by latch part 130 are then input in unit 200, which thereby outputs the external output echo clocks (XCQ) to the outside (for instance, out of the system).

Figure 9:
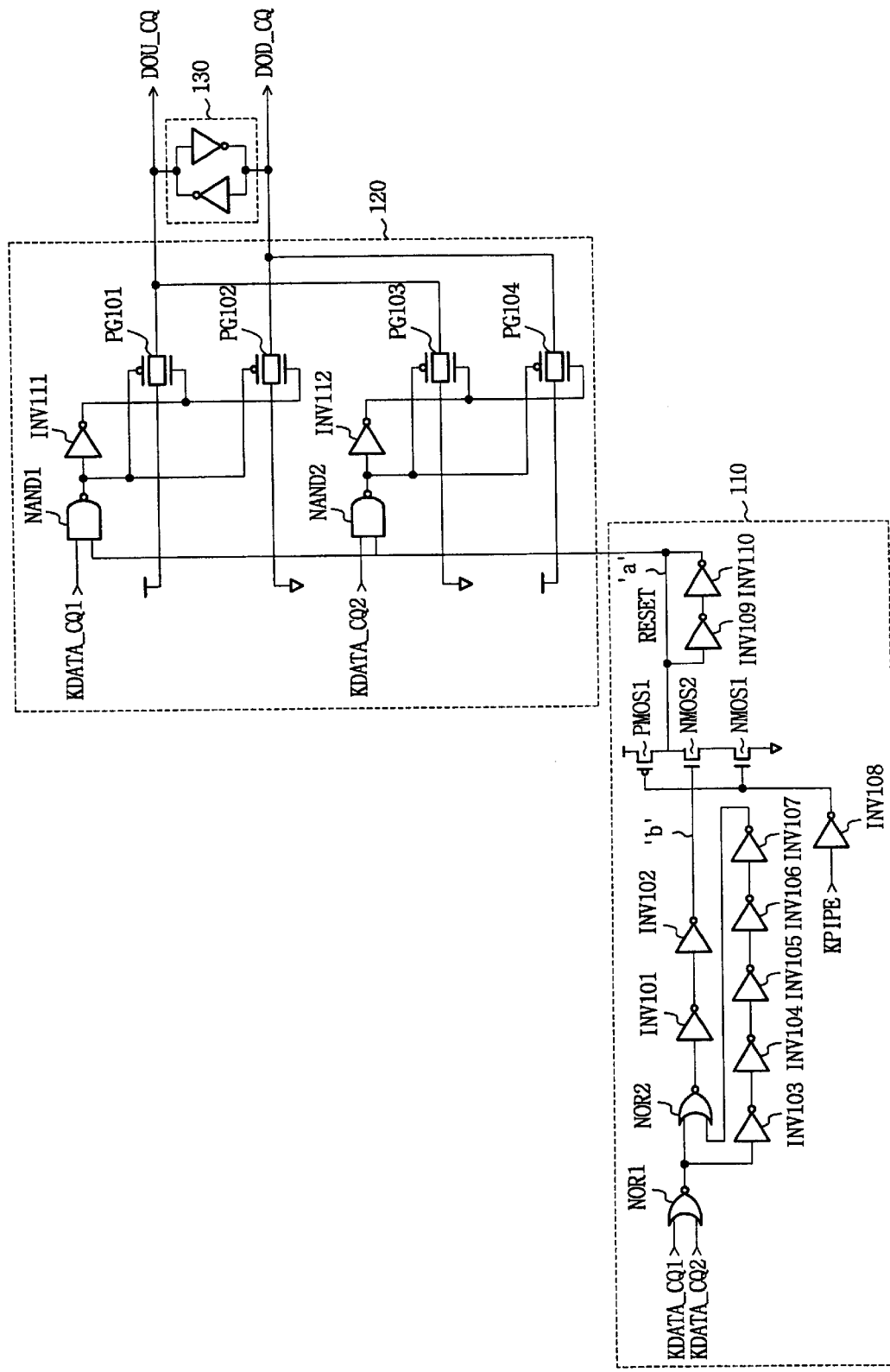
FIG. 9 is an exemplary view for illustrating a specific circuit of generating a data output buffer (DOB-CQ) in accordance with the preferred embodiment of the present invention shown in FIG. 5.

FIG. 9 is a detailed schematic for a data output buffer (DOB_CQ) 100 in accordance with the present invention of FIG. 4 and FIG. 5. Indeed, blocks 110, 120, 130 may be identified. The RESET signal is produced on node 'a'.

The delay control circuit part 110 is constructed in a connected circuit comprising NOR gates NOR1, NOR2, inverters INV101 through INV110, a PMOS transistor PMOS1, and NMOS transistors NMOS1, NMOS2. According to the circuit of the delay control circuit part 110, the NOR1 receives an input of KDATA_CQ1 and KDATA_CQ2. Furthermore, an output of NOR1 is inputted to NOR2, and an output of NOR1 passes through inverters INV103 through INV107 to input to NOR2. An output of NOR2 passes through inverters INV101 and INV102 to get connected to a gate end of the NMOS2. On the other hand, the transistors are in connection of [PMOS1–NMOS2–NMOS1], where ends of the NMOS2 and the PMOS1 are connected with supply voltage and an end of the NMOS1 not connected with the NMOS2 is connected with ground voltage. Gates of the PMOS1 and NMOS1 are commonly connected with a signal formed by the KPIPE signal, which has passed through the inverter INV108. Also, an output node, RESET node 'a' is connected in a common connection line of PMOS1 and NMOS2, and inverters INV109, INV110 are connected with RESET node 'a' in parallel. The RESET signal is a delay control signal, inputting as a condition required for operating a signal pass circuit part 120.

In the delay control circuit part 110, when a KPIPE turns "high", the RESET node 'a' turns "high" by passing the inverter INV108 and turning on the PMOS1. The KPIPE is a pulse turning "low" after a predetermined period of time, so that the PMOS1 and NMOS1 turn off and on respectively. At this time, any "high" signal out of KDATA_CQ1 or the KDATA CQ2 feeds back to let the node 'b' turn "high", the RESET node 'a' turns "low." In other words, the RESET node 'a' can latch as "high" only when the KPIPE is "high".

In the embodiment of FIG. 9, signal pass circuit part 120 generates directly signals DOU_CQ, DOD_CQ, although that is not necessary for practicing the invention. And the signals stored by the latch part 130 are the same signals.

More particularly, pulse signals KDATA_CQ1 and KDATA_CQ2 are generated alternatingly, and used for generating echo clock signals DOU CQ, DOD_CQ. Part 120 includes four pass gates PG101 through PG104. These are controlled in pairs by pulse signals KDATA_CQ1 and KDATA_CQ2, through two inverters INV111, INV112. The RESET signal is NANDed with each of KDATA_CQ1 and KDATA_CQ2 through two NAND gates NAND1, NAND2 to generate intermediate signals, which in turn control the pass gates PG101 through PG104.

Strictly speaking, what is passed are permanent HIGH and LOW signals occurring before the pass gates PG101 through PG104. But it can be said that the pulse signals KDATA_CQ1 and KDATA_CQ2 are instead passed or outputted, because they control the state (and thus also the timing) of the pass gates PG101 through PG104.

The signal pass circuit part 120 and latch part 130 perform the aforementioned operations shown in FIG. 7, but only when the RESET node 'a', an output of the delay control circuit part (110), turns "high." At all cycles of the present invention, KDATA_CQ1 and KDATA_CQ2 are generated alternatingly. As shown in the wave form views of FIG. 11 and FIG. 13, the KDATA_CQ1 and KDATA_CQ2 are generated at the same time as the KDATA signal.

If the RESET signal is "high", the KDATA_CQ1 turns to a "high" pulse, the DOU_CQ turns "high", the DOD_CQ "low", the final XDOUT is "high." If the KDATA_CQ1 and KDATA_CQ2 signals respectively turn "high" at the following cycle, the DOU_CQ turns "low", the DOD_CQ "high", and the final XDOUT is "low."

Therefore, the delay control signal, RESET shifts "high" when the KPIPE turns "high." If the KPIPE turns "low", the RESET shifts "low" because any "high" signal of KDATA_CQ1 or KDATA_CQ2 feeds back.

In the aforementioned method, the delay control circuit part (110) senses latch timings of the external output data (XDOUT) with the RESET signal. If there is a delay in the speed 10 of the external output data (XDOUT), a signal generated by delaying KDATA_CQ1 and KDATA_CQ2 as long as the delayed XDOUT with an output of the RESET, is passed and latched at the latch part 130.

Figure 11:
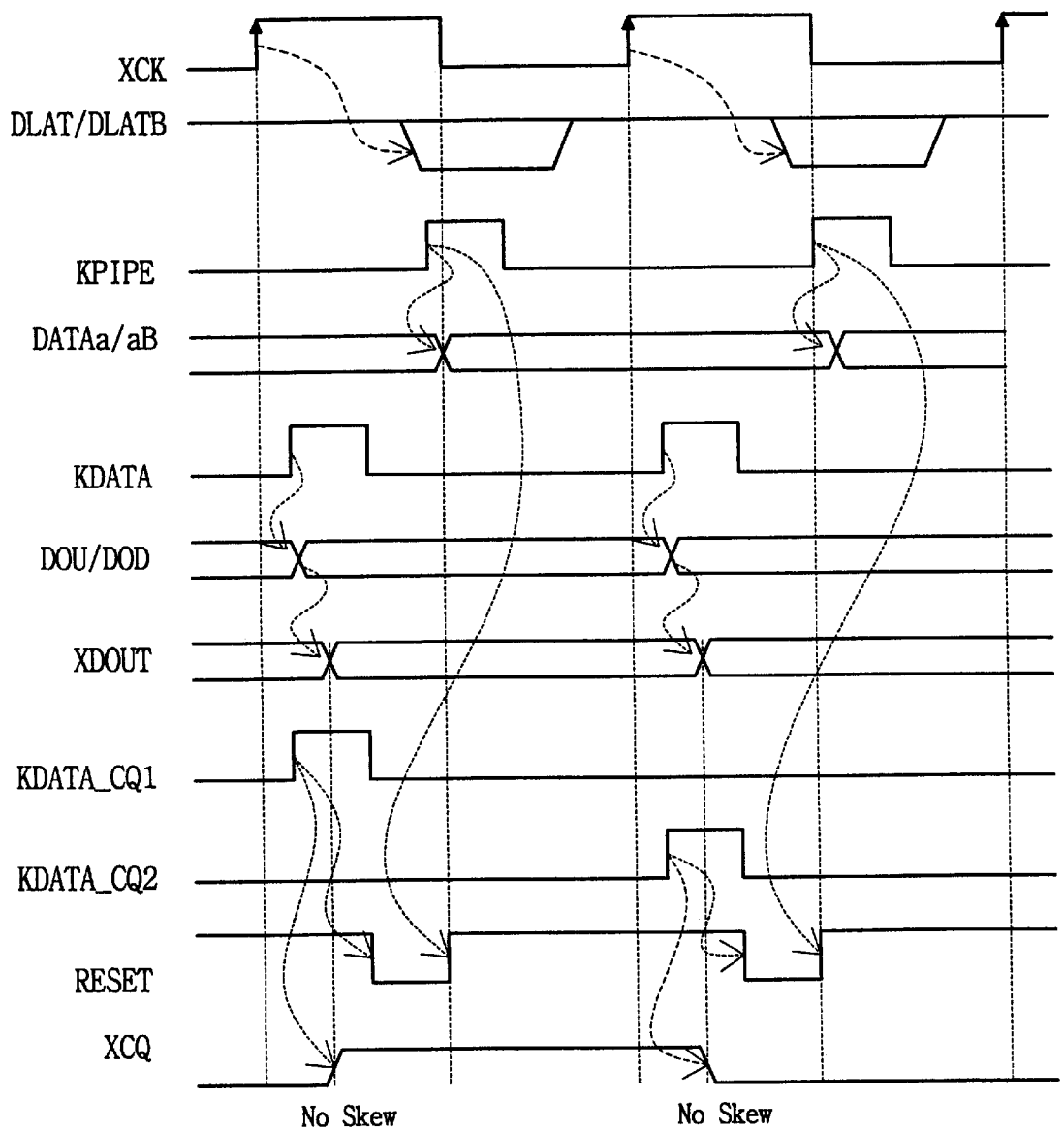
FIG. 11 illustrates wave form views of signals at the long cycle in accordance with the present invention.
Figure 13:
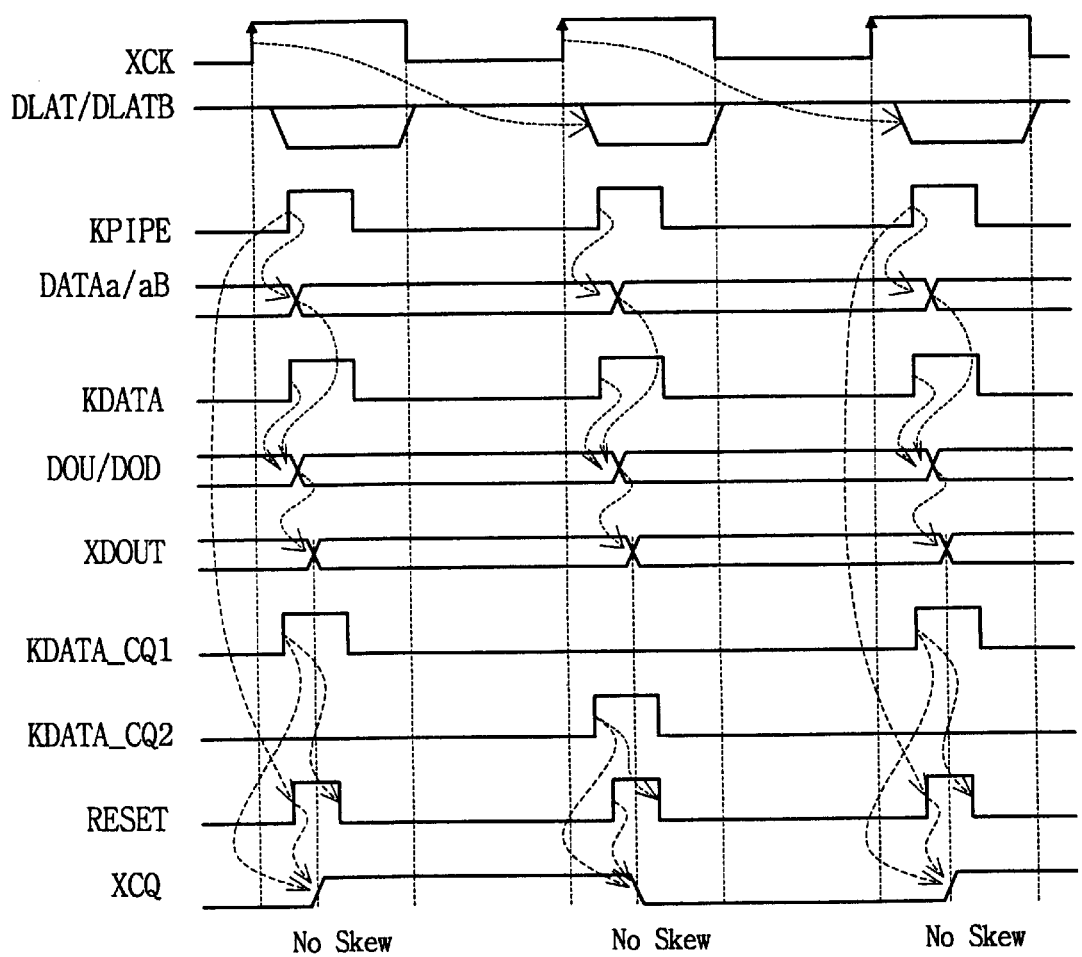
FIG. 13 illustrates wave form views of signals at the short cycle in accordance with the present invention.

FIG. 11 and FIG. 13 illustrate signal wave form views relevant to FIG. 4, FIG. 5 and FIG. 9 in accordance with the present invention. FIG. 11 illustrates signal wave form views at the long cycle, while FIG. 13 illustrates signal wave form views at the short cycle.

Referring to FIG. 11, the DATAa/DATAaB latches earlier with a sufficient margin than the KDATA of the following cycle, the RESET turns "high" at the timing of the "high" KPIPE. Therefore, there will be no speed skew at the long cycle owing to the same speed of XDOUT and XCQ. No delay is triggered by the RESET at the long cycle.

Referring to FIG. 13, at the short cycle the pulses of DATAa/DATAaB and KDATA overlap. The XCQ signal is generated after delaying as long as the delayed speed of XDOUT, at the time when the RESET signal shifts "high" by mixing the KPIPE to the KDATA_CQ1 and KDATA_CQ2. Therefore, it can be noted that the XCQ can track the delayed speed of XDOUT.

As described above, the data and echo clock tracking apparatus of the present invention can keep the speed of XDOUT and XCQ identical, by adaptively delaying the XCQ as long as the delayed speed of the XDOUT at the short cycle, so as to prevent generation of a speed skew between XDOUT and XCQ at the short cycle as well. This is accomplished by the generation of the RESET signal by mixing the KPIPE, a pipelined drive signal, to thereby absorb any developing skew between XCQ and XDOUT.

An additional embodiment of the invention is now described. The additional embodiment provides a data output buffer for an echo clock, which may be controlled by at least one of the data signals (DLAT/DLATB), instead of one of the buffer control signals. The data signal (DLAT/DLATB) is mixed with KDATA_CQ1 and KDATA_CQ2 to generate the delay control signal RESET.

Similarly good performance is achieved, when the teachings of FIG. 5 and FIG. 9 are applied. For example, the additional embodiment may be made from a delay control circuit part that generates the RESET signal, and a signal pass circuit part that operates responsive to the RESET signal, etc. A person skilled in the art will determine exactly how to form the detailed circuits for each, etc.

Also, even if the detailed description is made about a synchronous pipelined semiconductor product as a preferred embodiment of the present invention, the scope of the present invention covers all the products that need tracking to prevent a speed skew between data and echo clocks by using echo clocks.

The invention also provides methods. A first such method includes buffering data responsive to a buffer control signal, and then generating, responsive to the buffer control signal, an echo clock signal to accompany the data. Generating may include mixing an echo control signal with the buffer control signal to generate a reset signal, and outputting, responsive to the reset signal, the echo control signal as the echo clock signal.

A second such method includes outputting data to an off chip driver. In addition, an echo clock signal is generated responsive to the data, and the echo clock signal is outputted to the off chip driver. Generating may include mixing an echo control signal with the data to generate a reset signal, and outputting, responsive to the reset signal, the echo control signal as the echo clock signal.

As described above there is an advantage of the present invention in that the data and echo clock tracking apparatus can prevent a speed skew by assimilating external output data and echo clocks in spite of any changes in operational cycles.

There is another advantage of the present invention in that the data and echo clock tracking apparatus is adequate to a high speed synchronous semiconductor memory device, preventing any delay in speed and stabilizing the system.

There is still another advantage of the present invention in that the tracking between data and echo clocks is made possible by a simple modification of the internal circuit, increasing an access speed and generating the same echo clocks of read/write.

In addition, a number of specific, detailed parts like the specific circuit designs are also provided in the present description for general understandings of the present invention. It will be clearly understood by those skilled in the art that the present invention can be practiced without those specific detailed parts described above. Other detailed descriptions about well-known functions and structures will be omitted, so as not to obscure unnecessarily the present description.

What is claimed is:

1. A circuit comprising:
   a delay control circuit adapted to generate a reset signal responsive to a buffer control signal and an echo control signal; and
   a signal pass circuit adapted to generate an echo clock signal responsive to the reset and echo control signal.

2. The circuit of claim 1, wherein
   the echo control signal includes first and second pulse signals alternating with the same timing as a second buffer control signal.

3. The circuit of claim 1, wherein
   the echo control signal includes two pulsed signals, and the signal pass circuit includes:
      two NAND gates for NANDing the reset signal wit each of the pulsed signals to generate intermediate signals, and
      four pass gates, controlled in pairs by the intermediate signals.

4. The apparatus of claim 1 wherein the echo control signal includes at least two alternating pulse signals.

5. The apparatus of claim 1 wherein the signal pass circuit includes:
   a plurality of NAND gates adapted to logically manipulate the reset signal the echo control signal to generate intermediate signal; and
   a plurality of pass gates adapted to operate responsive to the intermediate signals.

6. A method comprising:
   generating a reset signal responsive to responsive to a buffer control signal and an echo control signal; and
   generating an echo clock signal responsive to the reset and echo control signal.

7. The method of claim 6 wherein generating a reset signal includes: delaying the echo control signal responsive to the buffer control signal.

8. The method of claim 6 wherein generating a reset signal includes: alternating at least two pulse signals as the echo control signal.

* * * * *

UNITED STATES PATENT AND TRADEMARK OFFICE
CERTIFICATE OF CORRECTION

PATENT NO. : 6,678,193 B2
DATED : January 13, 2004
INVENTOR(S) : Kim et al.

It is certified that error appears in the above-identified patent and that said Letters Patent is hereby corrected as shown below:

Title page,
Item [30], Foreign Application Priority Data, "Jul. 27, 2000 (KR) ...... 2000-43323" should read -- Jul. 24, 2000 (KR) ...... 2000-43323 --.

Column 1,
Line 48, "static products." should read -- static RAM (SRAM) products. --.

Column 4,
Line 64, "by IMB co." should read -- by IBM co. --.

Column 5,
Line 41, "DOB CQ 100" should read -- DOB_CQ 100 --.

Column 6,
Line 67, "KDATA CQ2" should read -- KDATA_CQ2 --.

Column 7,
Line 9, "DOU CQ," should read -- DOU_CQ, --.
Line 44, "speed 10 of" should read -- speed of --.

Colum 9,
Line 16, "signal wit each" should read -- signal with each --.

Signed and Sealed this

Sixth Day of July, 2004

JON W. DUDAS
*Acting Director of the United States Patent and Trademark Office*